(12) United States Patent
Kim et al.

(10) Patent No.: US 10,727,300 B2
(45) Date of Patent: Jul. 28, 2020

(54) SEMICONDUCTOR DEVICE AND MANUFACTURING METHOD THEREOF

(71) Applicant: MagnaChip Semiconductor, Ltd., Cheongju-si (KR)

(72) Inventors: Guk Hwan Kim, Cheongju-si (KR); Jin Yeong Son, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/869,521

(22) Filed: Jan. 12, 2018

(65) Prior Publication Data

US 2019/0019866 A1 Jan. 17, 2019

(30) Foreign Application Priority Data

Jul. 13, 2017 (KR) ........................ 10-2017-0089116

(51) Int. Cl.
| | |
|---|---|
| *H01L 29/08* | (2006.01) |
| *H01L 21/225* | (2006.01) |
| *H01L 29/423* | (2006.01) |
| *H01L 29/78* | (2006.01) |
| *H01L 21/311* | (2006.01) |
| *H01L 27/088* | (2006.01) |
| *H01L 29/66* | (2006.01) |

(Continued)

(52) U.S. Cl.
CPC ...... *H01L 29/0852* (2013.01); *H01L 21/2253* (2013.01); *H01L 21/311* (2013.01); *H01L 21/823418* (2013.01); *H01L 21/823462* (2013.01); *H01L 27/088* (2013.01); *H01L 29/42316* (2013.01); *H01L 29/42368* (2013.01); *H01L 29/66659* (2013.01); *H01L 29/7835* (2013.01); *H01L 29/7836* (2013.01); *H01L 29/7856* (2013.01); *H01L 29/1045* (2013.01); *H01L 29/665* (2013.01); *H01L 29/7833* (2013.01)

(58) Field of Classification Search
None
See application file for complete search history.

(56) References Cited

U.S. PATENT DOCUMENTS

| | | | | |
|---|---|---|---|---|
| 4,723,168 | A * | 2/1988 | Theuwissen | G11C 27/04 257/E27.154 |
| 5,536,675 | A * | 7/1996 | Bohr | H01L 21/76229 148/DIG. 50 |
| 6,117,738 | A | 9/2000 | Tung | |

(Continued)

*Primary Examiner* — Anthony Ho
*Assistant Examiner* — Kevin Quinto
(74) *Attorney, Agent, or Firm* — NSIP Law

(57) ABSTRACT

A semiconductor device, includes a first conductive type first doping area, a second conductive type second doping area, a source region, a drain region, a gate insulating film, and a gate electrode. The first conductive type first doping area is formed in a substrate region. The second conductive type second doping area is formed in the substrate to be spaced apart from the first conductive type first doping area. The source region is formed in the first conductive type first doping area. The drain region is formed in the second conductive type second doping area. The gate insulating film is formed between the source region and the drain region. A thickness of a first end of the gate insulating film is different than a thickness of a second end of the gate insulating film. The gate electrode formed on the gate insulating film.

26 Claims, 6 Drawing Sheets

(51) Int. Cl.
*H01L 21/8234* (2006.01)
*H01L 29/10* (2006.01)

(56) References Cited

U.S. PATENT DOCUMENTS

| | | | |
|---|---|---|---|
| 7,973,333 B2 | 7/2011 | Dietz et al. | |
| 2003/0141559 A1* | 7/2003 | Moscatelli | H01L 21/28167 257/406 |
| 2009/0108347 A1* | 4/2009 | Adkisson | H01L 29/42368 257/339 |
| 2011/0039378 A1 | 2/2011 | Voldman | |
| 2013/0020632 A1 | 1/2013 | Disney | |
| 2015/0102405 A1* | 4/2015 | Ryu | H01L 29/42368 257/336 |
| 2016/0172489 A1* | 6/2016 | Chen | H01L 29/7835 257/343 |
| 2016/0190269 A1* | 6/2016 | Brown | H01L 29/66659 438/286 |

\* cited by examiner

SEMICONDUCTOR DEVICE AND MANUFACTURING METHOD THEREOF

CROSS-REFERENCE TO RELATED APPLICATIONS

This application claims the benefit under 35 U.S.C. 119(a) of Korean Patent Application No. 10-2017-0089116 filed on Jul. 13, 2017 in the Korean Intellectual Property Office, the entire disclosure of which is incorporated herein by reference for all purposes.

BACKGROUND

1. Field

The present disclosure relates to a semiconductor device and a manufacturing method thereof, and more particularly, to an N channel extended drain MOS (nEDMOS) including a step gate insulating film or a connecting insulating film which is used for a level shifter block of a display driver IC and a manufacturing method thereof.

2. Description of Related Art

A level shifter block is a device which boosts a voltage level from a low voltage to a high voltage in a display driver IC included in a mobile device. The level shifter block occupies a relatively large area in the display driver IC because the level shifter block is basically provided for all channels. Even though efforts have been made to reduce the area occupied by the conventional level shifter block, due to the desired driving current, positive results are difficult to attain.

Double diffused metal oxide semiconductor (DMOS) semiconductor devices such as an N channel lateral double-diffused MOS (nLDMOS) or an N channel extended drain MOS (nEDMOS) have been frequently used as the level shifter. In the level shifter which is formed of a DMOS semiconductor device, a thick gate insulating film is preferably used because the level shifter needs to withstand a high drain voltage. However, there is a problem in that a desired drain current Idsat cannot be obtained by the thick gate insulating film due to a low gate input voltage. Further, the desired drain current Idsat value cannot be obtained from a drift region that has been used for the DMOS device of the related art, due to a low doping concentration. Further still, there is a limitation in adjusting a leakage current Ioff to be a predetermined value or lower due to insufficient margin for adjusting a channel length.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a semiconductor device including: a substrate; a first conductive type first well region formed on the substrate; a first conductive type first doping area formed in the first conductive type first well region; a second conductive type second doping area which is formed in the first conductive type first well region and is spaced apart from the first conductive type first doping area; a source region formed in the first conductive type first doping area; a drain region formed in the second conductive type second doping area; a gate insulating film formed between the source region and the drain region; and a gate electrode formed on the gate insulating film. The gate insulating film includes: a thin gate insulating film; a thick gate insulating film; and a connecting insulating film disposed between the thin gate insulating film and the thick gate insulating film. The thin gate insulating film is formed to closer to the source region and the thick gate insulating film is formed to closer to the drain region.

A lower surface of the thin gate insulating film and a lower surface of the thick gate insulating film may be coplanar to each other.

A thickness of the connecting insulating film may increase towards the thick gate insulating film, and the gate electrode may cover more than half a length of the thick gate insulating film.

An upper surface of the connecting insulating film may have a slope and upper surfaces of the thin gate insulating film and the thick gate insulating film may be even.

The first conductive type first doping area may be formed extended to a partial area of the thin gate insulating film in a direction of the source region to the drain region.

The second conductive type second doping area may be formed extended to a partial area of the thin gate insulating film in a direction of the drain region to the source region.

The second conductive type second doping area may be formed extended only to a partial area of the thick gate insulating film in a direction of the drain region to the source region.

The second conductive type second doping area may pass through the thick gate insulating film to extend to a partial area of the connecting insulating film in a direction of the drain region to the source region.

The connecting insulating film may connect the thin gate insulating film and the thick gate insulating film to each other.

The semiconductor device may further include: first, second, and third isolation regions which are sequentially formed on the substrate; a second conductive type deep well region formed over the first and third isolation regions; and a second conductive type highly-doped area which is formed between the first and second isolation regions and is in contact with the second conductive type deep well region.

The drain region may be spaced apart from the thick gate insulating film.

The semiconductor device may further include a silicide blocking insulating film disposed between the drain region and the thick gate insulating film and the silicide blocking insulating film may be in direct contact with the substrate surface.

The second conductive type second doping area may be in direct contact with the silicide blocking insulating film.

The semiconductor device may further include a silicide formed on the gate electrode, the source region, and the drain region.

In another general aspect, a method of manufacturing a semiconductor device includes forming a first conductive type first well region in a substrate; forming a first gate insulating film on the first conductive type first well region, the first gate insulating film comprising a thin gate insulating film, a thick gate insulating film and a connecting insulating film connecting the thin gate insulating film and the thick gate insulating film, wherein a lower surface of the thin gate insulating film and a lower surface of the thick gate insulating film are coplanar to each other; forming a first gate electrode on the first gate insulating film; and forming a source region and a drain region in substrate. The thin gate insulating film is formed closer to the source region than the drain region, the thick gate insulating film is formed closer to the drain region than the source region, and the connecting insulating film is disposed between the thin gate insulating film and the thick gate insulating film. A thickness of the connecting insulating film varies from a thickness of the thin gate insulating film and to a thickness of the thick gate insulating film.

The first gate electrode may cover more than half a length of the thick gate insulating film.

The semiconductor device may further include forming a first conductive type first doping area and a second conductive type second doping area in the first conductive type first well region, wherein the source region and the drain region are formed in the first conductive type first doping area and the second conductive type second doping area, respectively.

The semiconductor device may further include forming a first conductive type second well region to be spaced apart from the first conductive type first well region; forming a second conductive type second drift region in the first conductive type second well region; and forming a second gate insulating film in the first conductive type second well region having similar thickness to the thickness of the thick gate insulating film.

The semiconductor device may further include forming a first conductive type third well region to be spaced apart from the first conductive type first well region; and forming a third gate insulating film in the first conductive type third well region having similar thickness to the thickness of the thin gate insulating film.

In another general aspect, a semiconductor device, includes a first conductive type first doping area, a second conductive type second doping area, a source region, a drain region, a gate insulating film, and a gate electrode. The first conductive type first doping area is formed in a substrate region. The second conductive type second doping area is formed in the substrate to be spaced apart from the first conductive type first doping area. The source region is formed in the first conductive type first doping area. The drain region is formed in the second conductive type second doping area. The gate insulating film is formed between the source region and the drain region. A thickness of a first end of the gate insulating film is different than a thickness of a second end of the gate insulating film. The gate electrode formed on the gate insulating film.

The thickness of the first end of the gate insulating film may be smaller than the thickness of the second end of the gate insulating film.

The first end of the gate insulating film may be formed closer to the source region than the drain region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
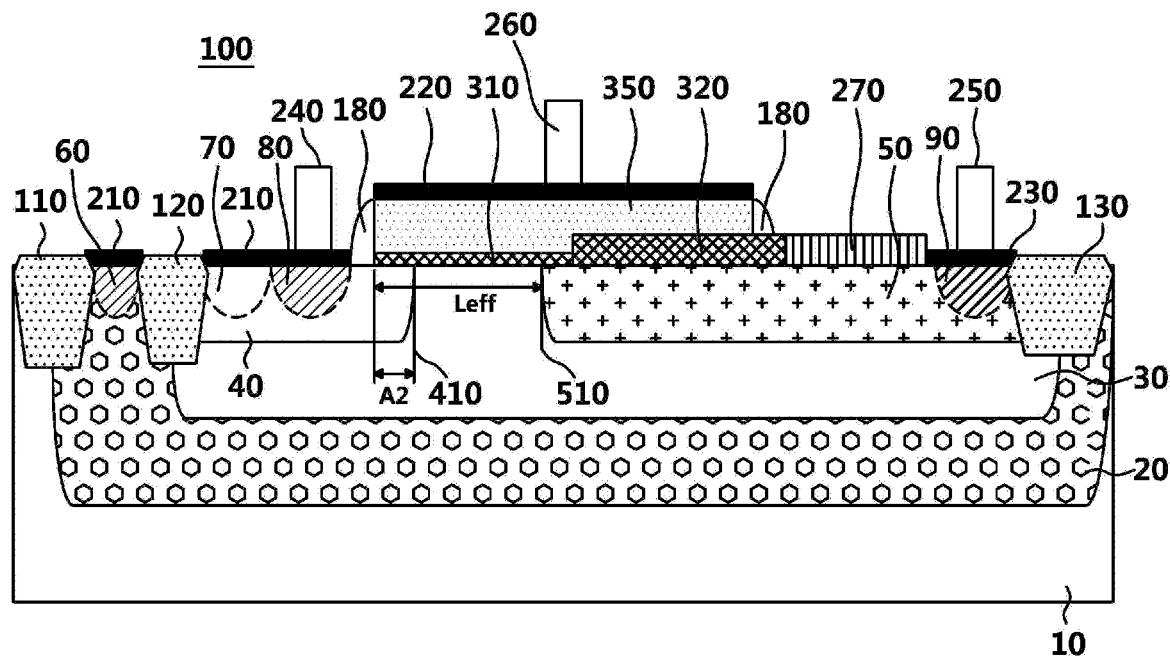
FIGS. 1 and 2 are cross-sectional views of an example of a double diffused metal oxide semiconductor (DMOS) semiconductor device including a step gate insulating film.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Examples of the present disclosure provide a semiconductor device that includes a thin gate insulating film and a thick gate insulating film having different thicknesses provided in one gate insulating film and a connecting insulating film provided at an interface thereof, and a manufacturing method thereof.

Examples further include a semiconductor device that includes a doping area extending from a drain region to a thin gate insulating film area to satisfy a leakage current Ioff, a drain current Idsat, and Vt, and a manufacturing method thereof.

The examples include a semiconductor device that has a high drain current even at a low gate input voltage and a manufacturing method thereof.

Examples include a semiconductor device that adjusts a length of a doping area (extended drain junction) in a channel in which a step gate insulating film is formed to adjust a channel length in accordance with device characteristics, and a manufacturing method thereof.

Figure 2:
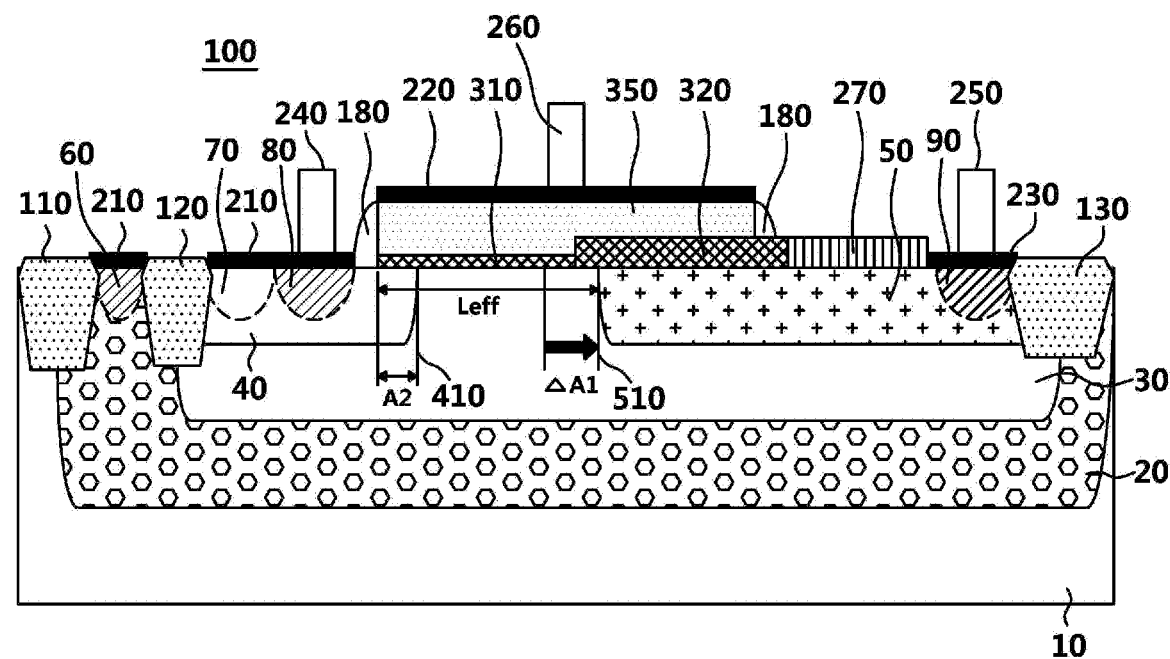

FIGS. 1 and 2 are cross-sectional views of an example of a DMOS semiconductor device 100 including a step gate insulating film. Here, the double diffused metal oxide semiconductor (DMOS) includes an n-channel lateral double-diffused metal oxide semiconductor (nLDMOS) or an n-channel extended drain metal oxide semiconductor (nEDMOS) device.

As illustrated in FIG. 1, the semiconductor device 100 includes a first conductive type (P) well region 30 formed on a substrate 10, and gate insulating films 310 and 320 having different thicknesses on the well region 30. Further, a gate electrode 350 is formed on the gate insulating films 310 and 320. Second conductive type (N) drain region 90 and source region 80 are disposed at opposing sides of the gate electrode 350. That is, when the gate insulating film 310 (having a small thickness) is formed close to the source region 80, the gate insulating film 320 (having a large thickness) is formed closer to the drain region 90. Since a drain voltage is higher than a source voltage, the thicknesses of the gate insulating films 310 and 320 is increased from the source region 80 to the drain region 90.

In the related art, only the thick gate insulating film is used without providing the thin gate insulating film. That is, in the device of the related art, a thick gate insulating film suitable for a medium voltage (MV) and a high voltage (HV) is used. When a voltage of 0.5 to 10 V is applied to a gate electrode 350, the drain current Idsat is too low due to the thick gate insulating film. Therefore, in order to raise the drain current, the width of the channel region needs to be large. However, in this case, the area of the device undesirably becomes too large.

When only the thin gate insulating film 310 having a relatively small thickness is used, the drain current may be increased; however, a thick gate insulating film 320 is used due to a high voltage being applied to the drain region 90. The use of a thick gate insulating film 320 prevents the thin gate insulating film 310 from being broken due to high voltage. When a thin gate insulating film 310 is formed close to the drain region 90, the thin gate insulating film breaks and adversely affects the device's characteristics.

A first conductive type (P) first doping area 40 and a second conductive type (N) second doping area 50 are formed in a first conductive type (P) well region 30. The first conductive type (P) first doping area 40 extends to a partial area of the thin gate insulating film 310 in a direction of the source region 80 to the drain region 90. A right outer edge 410 of the first conductive type (P) first doping area 40 extends from a gate edge by width A2 of the thin gate insulating film 310.

The first conductive type (P) first doping area 40 serves as a channel. The first conductive type (P) first doping area 40 increases a threshold voltage when compared with a case in which only the first conductive type first well region 30 is provided. This is because the concentration of a P-type impurity is increased as compared with the case when only the first conductive type first well region 30 is provided. The leakage current Ioff may be reduced due to the increased threshold voltage. The interface of the source region 80 serves to reinforce the concentration of a P-type dopant. Extension of a depletion region by the source region 80 is reduced to prevent punch-through. Further, a Vt adjusting ion implantation region for adjusting Vt of the EDMOS semiconductor device may be formed in the P-type well region 30.

The semiconductor device 100 of the present disclosure includes a second conductive type (N) second doping area 50 which encloses the drain region 90. The second conductive type (N) second doping area 50 extends to the thin gate insulating film 310. The second conductive type (N) second doping area 50 implants ions at a higher energy than that in the drain region 90 to enclose the drain region 90. Further, the second conductive type (N) second doping area 50 is higher doped than a drift region of the related art so that resistance is low to provide a high drain current.

As the dose amount of doping in the second conductive type (N) second doping area 50 is increases, so does the saturation drain current Idsat. However, as the dose amount is increased, the device may become unreliable due to issues such as a breakdown voltage. Therefore, it is necessary to optimize the ion implantation dose amount of the second conductive type (N) second doping area 50 within a range which appropriately satisfies the saturation drain current Idsat and breakdown voltage. The optimized ion implantation dose amount of the second conductive type (N) second doping area 50 is ranged between the P-type well region 30 and the drain region 90. The second conductive type (N) second doping area 50 is higher doped than the P-type well region 30 and is lower doped than the drain region 90.

The second conductive type (N) second doping area 50 may be formed using ion implantation for adjusting a logic well threshold voltage. The ion implantation for adjusting a logic well threshold voltage is performed with low energy, which is used to form a low voltage (LV) device. Since the energy of the logic well threshold voltage ion implantation is low, the second conductive type (N) second doping area 50 near the surface of the substrate 10 is thin. The second conductive type (N) second doping area 50 is formed extended not only to the thick gate insulating film 320 but also to the thin gate insulating film 310 in the direction of the drain region 90 to the source region 80. The length of the second conductive type (N) second doping area 50 is larger than the length of the thick gate insulating film 320.

The channel length is reduced to Ieff by the second conductive type (N) second doping area 50. Here, the effective channel length Leff in FIG. 1 is a distance starting from the left side wall of the gate electrode 350 to the left outer edge 510 of the second conductive type (N) second doping area 50. Further, the second conductive type (N) second doping area 50 is higher doped than a second drift region 190 of a high voltage semiconductor device 200 or a third drift region 195 of a medium voltage semiconductor device 300 so that a resistance thereof is low.

Accordingly, the channel length is reduced, the resistance becomes low, and the thin gate insulating film 310 is used so that the drain current Idsat, which is approximately 10 times higher than that of the existing DMOS device is provided. This is possible because the gate insulating films 310 and 320 are configured by a step gate insulating film in which the thin gate insulating film 310 of a low voltage LV and the thick gate insulating film 320 of a medium voltage MV are combined while also using the second conductive type (N) second doping area 50. That is, since there is a thin gate insulating film 310, a high drain current is available.

The source region 80 is formed by overlapping a spacer 180 formed at a side of the gate electrode 350. In contrast, the drain region 90 is formed to be spaced apart from the spacer 180 of the gate electrode 350 with a predetermined interval so as to increase the breakdown voltage. A non-silicide area for increasing a gate-drain breakdown voltage is provided between the gate electrode 350 and the highly-doped drain region 90. The predetermined interval between the spacer 180 and the drain region 90 is determined to satisfy the breakdown voltage to be shown at least above 10V, for example. In order to form the non-silicide region, a silicide blocking insulating film 270 is formed between the drain region 90 and the thick gate insulating film 320 on the substrate. The blocking insulating film 270 may use any one of SiON, SiO2, and SiN or a combination thereof. In some cases, silicide may be applied without providing the non-silicide area.

A deep N-typed well (DNW) area 20 is formed between the first conductive type (P) well region 30 and the substrate 10. The DNW area 20 is used for separating the semiconductor device from other devices. When other semiconductor in which a P-typed well (PW) is formed is disposed next to the semiconductor device, there is no need to separate the other semiconductor; therefore, in that case, the DNW is not used.

First, second, and third isolation regions 110, 120, and 130 which are formed of a trench for separating an adjacent device are sequentially formed at the side of the drain region 90 or the source region 80. Here, the trench may be selected from shallow trench isolation (STI), medium trench isolation (MTI), and deep trench isolation (DTI) depending on required specifications of the device. Alternately, a LOCOS oxide layer may be used instead of the trench.

A first conductive type (P) first pick-up region 70 which applies a bias voltage to the P-type well region 30 or the first conductive type (P) first doping area 40 may be disposed between the second isolation region 120 and the source region 80. Further, a second conductive type (N) second pick-up region 60 which applies a bias voltage to the DNW region 20 may be disposed.

The semiconductor device 100 includes silicides 210, 220, and 230 disposed on the second conductive type (N) second pick-up region 60, the first conductive type (P) first pick-up region 70, the source region 80, the drain region 90, and the gate electrode 350. The semiconductor device 100 further includes a source contact plug 240 and a drain contact plug 250 disposed on the silicides 210 and 230, respectively, and a gate contact plug 260 disposed on the silicide 220.

The voltage applied to the drain region 90 is 3.3 V or higher. The voltage applied to the gate electrode 350 is a gate voltage which is the lowest voltage, and is applied to a low voltage semiconductor device 400 used for a digital block. In the example embodiment of the present disclosure, a voltage of about 0.5 to 10 V is applied to the gate electrode 350. In order to transmit a signal from a digital block which is formed of an LV device to a block of the high voltage semiconductor device 200, a device according to the example embodiment of the present disclosure may be used for an intermediate area.

Therefore, the semiconductor device 100 according to the example embodiment of the present disclosure may be used for a mobile smart phone which requires a small chip size or a driving chip which drives a small/large display driver. Further, the semiconductor device may also be used for LED, LCD, AMOLED, or PMOLED display driver IC.

Further, the semiconductor device 100 has excellent channel length modulation (CLM) so as to configure a stable analog circuit. A thick LOCOS (a combination of local oxidation of silicon) or an STI (shallow trench isolation) insulating layer may be used between the gate electrode 350 and the drain region 90. However, by doing this, a curvature is formed between the gate insulating films 310 and 320 and the drain region 90 so that the drain current speed is lowered. Therefore, the surface of the substrate 10 between the thin gate insulating film 310 and the drain region 90 may be even to be coplanar to each other without forming the LOCOS or the STI insulating layer there between.

A step gate insulating film DMOS semiconductor device according to an example is illustrated in FIG. 2 and has a similar configuration to the configuration of the above-described example.

As illustrated in FIG. 2, a second conductive type (N) second doping area 50 is formed extended to a partial area of the thick gate insulating film 320 in the direction of a drain region 90 to a source region 80. An effective channel length Leff in FIG. 2 is increased by ΔA1 as compared with the effective channel length in FIG. 1. Therefore, Ioff is reduced.

Figure 3:
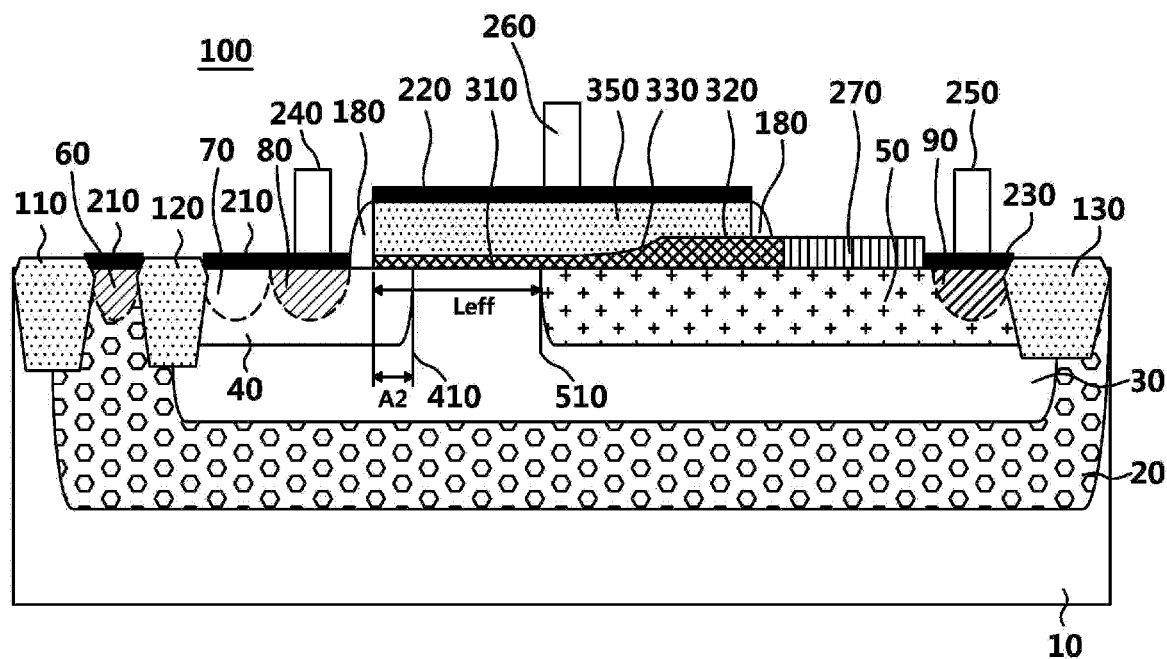
FIGS. 3, 4 and 5 are cross-sectional views of another example of a DMOS semiconductor device including a connecting insulating film.
Figure 4:
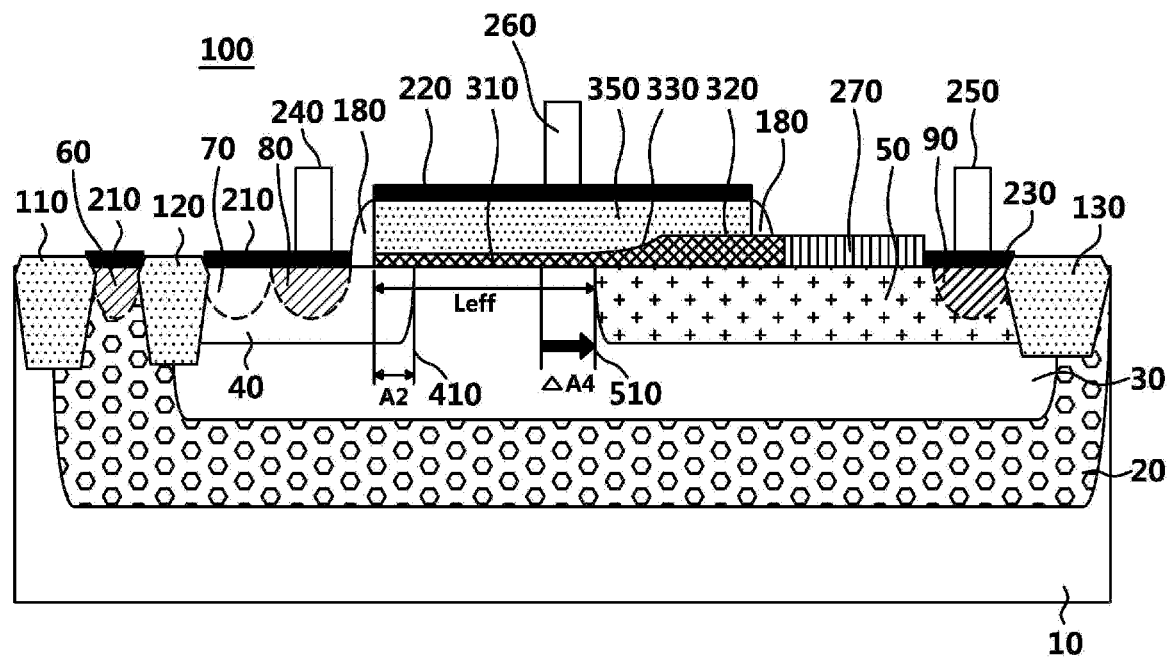
Figure 5:
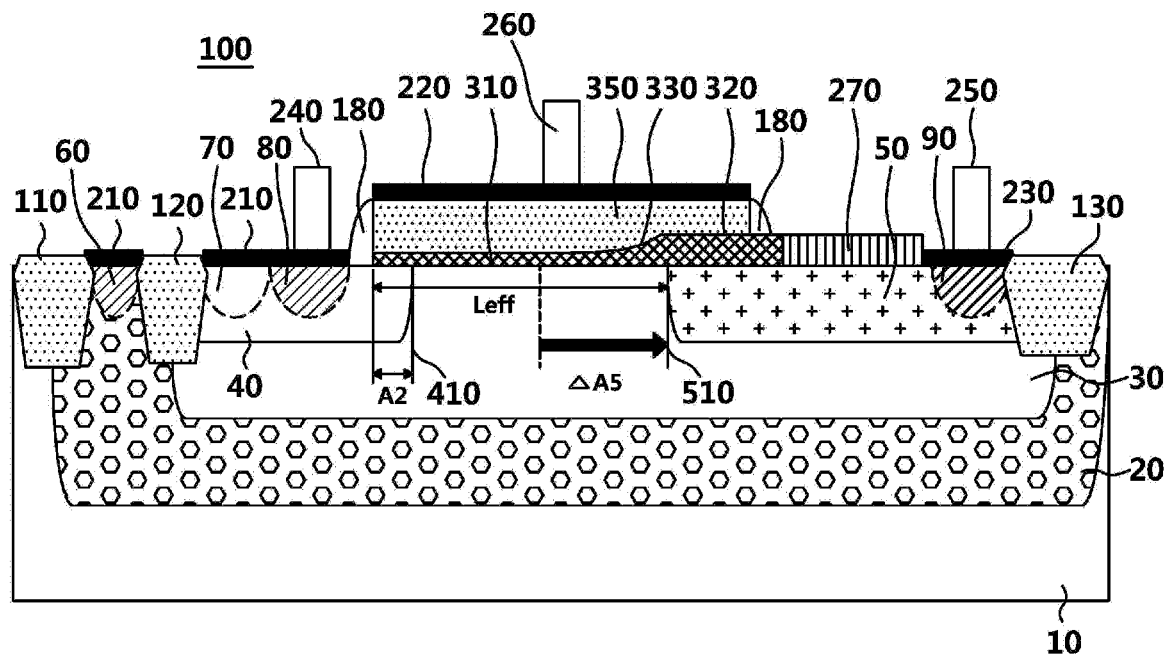

FIGS. 3 to 5 are cross-sectional views of a DMOS semiconductor device including a connecting insulating film according to another example.

As illustrated in FIGS. 3 to 5, another example of the present disclosure has a structure in which a step gate insulating film illustrated in FIGS. 1 and 2 is modified to a connecting insulation layer.

As illustrated in FIG. 3, a second conductive type (N) second doping area 50 is formed extended to a partial area of a thin gate insulating film 310 in the direction of a drain region 90 to a source region 80. A first conductive type (P) first doping area 40 is formed extended to a partial area of the thin gate insulating film 310 in the direction of a source region 80 to a drain region 90.

First, second, and third isolation regions 110, 120, and 130 are sequentially formed on a substrate 10. The semiconductor device 100 includes a second conductive type deep well region 20 formed on the substrate 10 and a first conductive type first well region 30 formed in the second conductive type deep well region 20. The semiconductor device 100 also includes a first conductive type first doping area formed in the first conductive type first well region 30 and the second conductive type (N) second doping area 50 which is formed in the first conductive type first well region 30 and is spaced apart from the first conductive type (P) first doping area 40. The semiconductor device 100 also includes a source region 80 formed in the first conductive type (P) first doping area 40 and a drain region 90 formed in the second conductive type (N) second doping area 50.

Here, the second conductive type deep well region 20 is formed over first and third isolation regions 110 and 130. The first conductive type first well region 30 is formed over the second and third isolation regions 120 and 130.

Further, the semiconductor device 100 includes gate insulating films 310 and 320 formed on the substrate 10 and a gate electrode 350 formed on gate insulating films 310, 320, and 330. Here, the gate electrode 350 covers more than half the length of the thick gate insulating film 320. Further, the gate insulating films 310, 320, and 330 are formed between the source region 80 and the drain region 90. The gate insulating films 310, 320, and 330 include a thin gate insulating film 310, a thick gate insulating film 320, and a connecting insulating film 330 disposed between the thin gate insulating film 310 and the thick gate insulating film 320.

The connecting insulating film 330 may be used when being in contact with the gate electrode 350 instead of the step gate insulating film. This is because the thickness of the connecting insulating film 330 progressively changes as compared to the step gate insulating film with more abrupt contours. This is caused by the shape of the connecting insulating film 330. The connecting insulating film 330 has a predetermined slope or a curved shape. Therefore, there is no empty space between the gate electrode 350 and the connecting insulating film 330. In contrast, since the thickness of the step gate insulating rapidly changes, when the gate electrode 350 is deposited, an empty space may be formed at the interface. The thickness of the connecting insulating film 330 varies from the thickness of the thin gate insulating film 310 to the thickness of the thick gate insulating film 320.

The thin gate insulating film 310 is near the source region 80 and the thick gate insulating film 320 is near the drain region 90.

Further, a lower surface of the thin gate insulating film 310 and a lower surface of the thick gate insulating film 320 are coplanar to each other and the thickness of the connecting insulating film 330 is increased toward the thick gate insulating film 320. Therefore, the connecting insulating film 330 connects the thin gate insulating film 310 and the thick gate insulating film 320 to each other.

Further, in the semiconductor device 100, an upper surface of the connecting insulating film 330 has a curved shape or a slope, and each upper surface of the thin gate insulating film 310 and/or the thick gate insulating film 320 is coplanar.

The semiconductor device 100 further includes a second conductive type highly-doped doping area, that is, a second conductive type (N) second pick-up region 60 which is formed between the first and second isolation regions 110 and 120 to be in contact with the second conductive type deep well region 20.

Further, the drain region 90 is spaced apart from the thick gate insulating film 320. The semiconductor device 100 further includes a silicide blocking insulating film 270 disposed between the drain region 90 and the thick gate insulating film 320. The silicide blocking insulating film 270 is in direct contact with the surface of the substrate 10. The second conductive type (N) second doping area 50 is in direct contact with the silicide blocking insulating film 270.

As illustrated in FIG. 4, a second conductive type (N) second doping area 50 is formed extended to a partial area of the connecting insulating film 330 in the direction of the drain region 90 to the source region 80. Therefore, the effective channel length Leff in FIG. 4 is increased by ΔA4 as compared with the effective channel length in FIG. 2. The remaining elements not described are the same as described in FIG. 3.

As illustrated in FIG. 5, the second conductive type (N) second doping area 50 is formed extended to a partial area of the thick gate insulating film 320 in the direction of the drain region 90 to the source region 80. The second conductive type (N) second doping area 50 does not extend to the thin gate insulating film 310; therefore, the effective channel length Leff in FIG. 5 is increased by ΔA5 as compared with the effective channel length in FIG. 2. The effective channel length of FIG. 5 is longer than that of FIG. 4. This is because the second conductive type (N) second doping area 50 does not extend to the thin gate insulating film 310 but extends only to a partial area of the thick gate insulating film 320. The effective channel length may be adjusted using the second conductive type (N) second doping area 50. The remaining elements not described are the same as described in FIG. 3.

In FIG. 3, the first conductive type first well region 30 is in contact with the thin gate insulating film 310 and in FIG. 4, the first conductive type first well region 30 is in contact with the thin gate insulating film 310 and the connecting insulating film 330. In FIG. 5, the first conductive type first well region 30 is in contact with the thin gate insulating film 310, the connecting insulating film 330, and the thick gate insulating film 320. The channel length or the effective channel length may be increased and Idsat value may be reduced in the order of FIG. 3, FIG. 4, and FIG. 5. However, the Ioff value is lower, so that the leakage current to the substrate 10 is reduced. Therefore, an appropriate effective channel length may be determined according to desired Idsat and Ioff.

Figure 6:
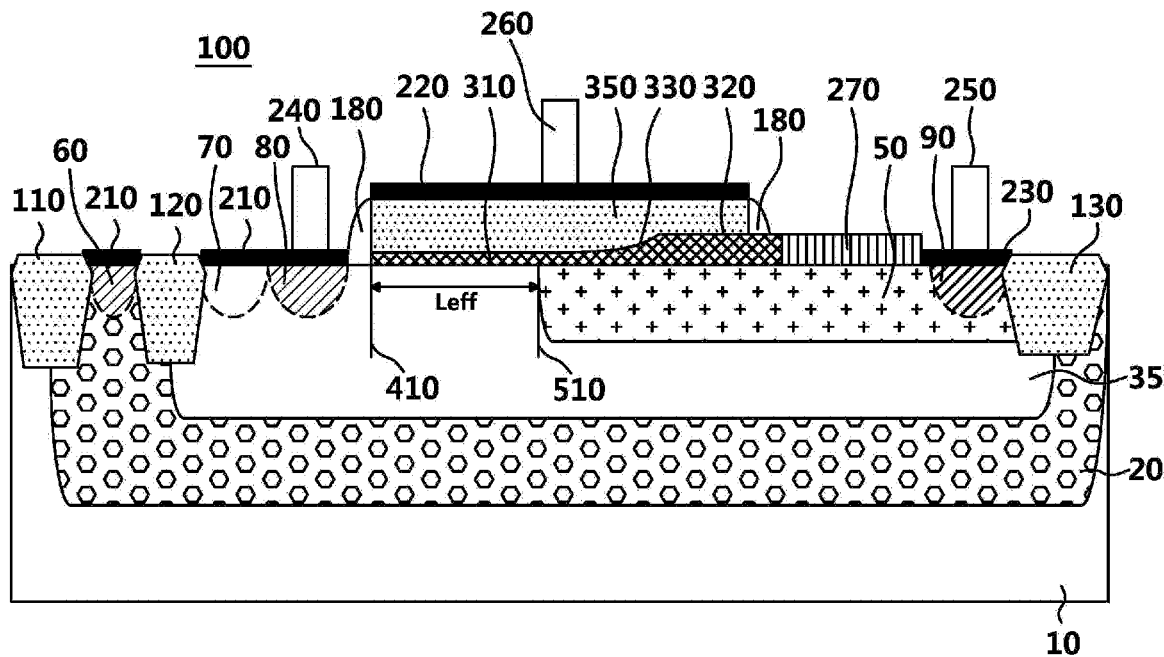
FIGS. 6 and 7 are cross-sectional views of another example of a DMOS semiconductor device including a third well region and a connecting insulating film.
Figure 7:
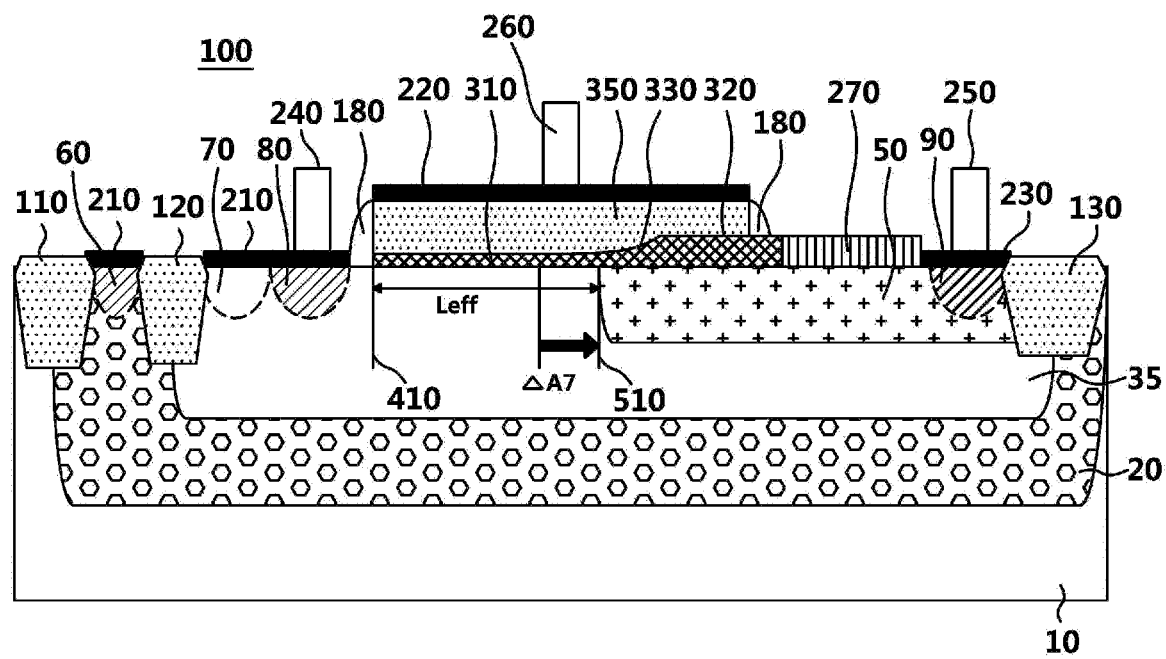

FIGS. 6 and 7 are cross-sectional views of a DMOS semiconductor device including a third well region and a connecting insulating film according to another example of the present disclosure.

As the above-described first conductive type first well region 30 of the semiconductor device 100, a medium voltage well region of a medium voltage semiconductor device or a second well region of a high voltage semiconductor device may be used. However, FIG. 6 illustrates a structure in which the medium voltage well region (or the second well region) 30 is replaced with the third well region 35. A dopant doping concentration of the third well region 35 is higher than that of the medium voltage/second well region 30. Therefore, Vt of the semiconductor device 100 is further increased. The first conductive type (P) first doping area 40 which encloses the source region 80 is not included in FIG. 6. The reason is that an added doping concentration of the medium voltage well region 30 and the first conductive type (P) first doping area 40 are similar to a doping concentration of the third well region 35. Since there is no first conductive type (P) first doping area 40, a manufacturing cost may be reduced.

The gate insulating films include a thin gate insulating film 310, a thick gate insulating film 320, and a connecting insulating film 330 disposed between the thin gate insulating film 310 and the thick gate insulating film 320. Further, a second conductive type (N) second doping area 50 is formed extended to a partial area of the thin gate insulating film 310 in the direction of a drain region 90 to a source region 80. A first conductive type (P) first doping area 40 is formed extended to a partial area of the thin gate insulating film 310 in the direction of the source region 80 to the drain region 90. The remaining parts are the same as those in FIG. 3 so that a description thereof will be omitted.

As illustrated in FIG. 7, the second conductive type (N) second doping area 50 is formed extended only to a partial area of the connecting insulating film 330 in the direction of the drain region 90 to the source region 80. Therefore, an effective channel length Leff in FIG. 7 is increased by ΔA7 as compared with the effective channel length in FIG. 2. Here, Leff is a length from a gate left edge to a left edge 510 of the second conductive type (N) second doping area 50. The remaining elements not described are the same as described in FIG. 3.

Figure 8:
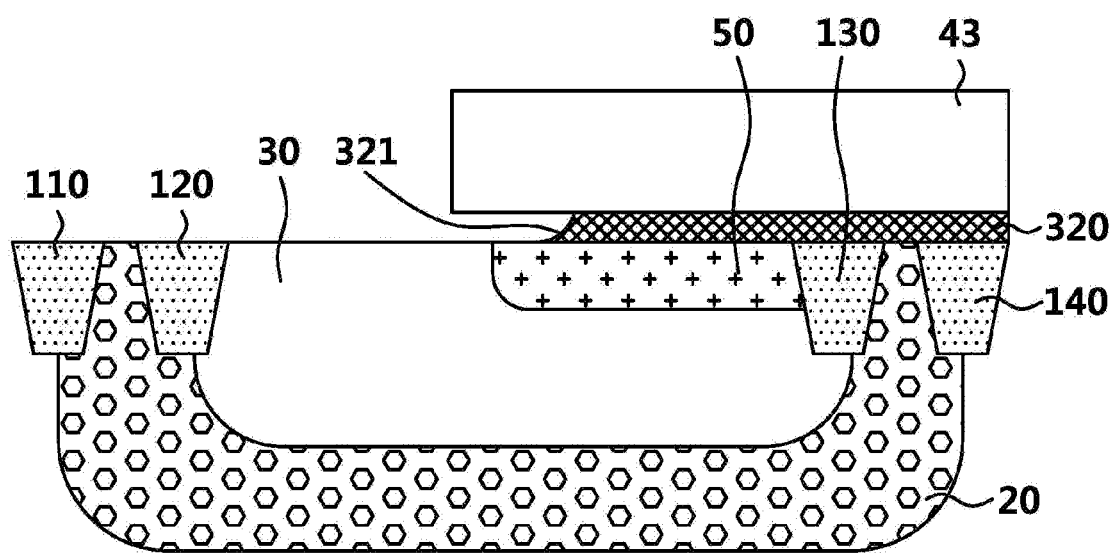
FIG. 8 is a cross-sectional view of a manufacturing method of a connecting insulating film of a DMOS semiconductor device according to examples of the present disclosure.

FIG. 8 is a cross-sectional view of a forming method of a connecting insulating film of a DMOS semiconductor device according to examples of the present disclosure.

The connecting insulating film 330 is formed by the following manufacturing process. Before forming a thin gate insulating film 310, a thick gate insulating film 320 is formed first and a photo mask 43 is patterned after. A wet etching process is performed to remove an exposed thick gate insulating film 320. The wet etching process is an isotropic etching process so that vertical and horizontal etchings are simultaneously generated. One part of the thick gate insulating film 320 has a slope or a curved surface 321 as illustrated in FIG. 8 with respect to a substrate surface, by the wet etching process. After the wet etching process, the patterned photo mask 43 is removed and the thin gate insulating film 310 is formed. Therefore, a connecting insulating film 330 which has a slope 321 at the interface of the thin gate insulating film 310 and the thick gate insulating film 320 may be formed.

Figure 9:
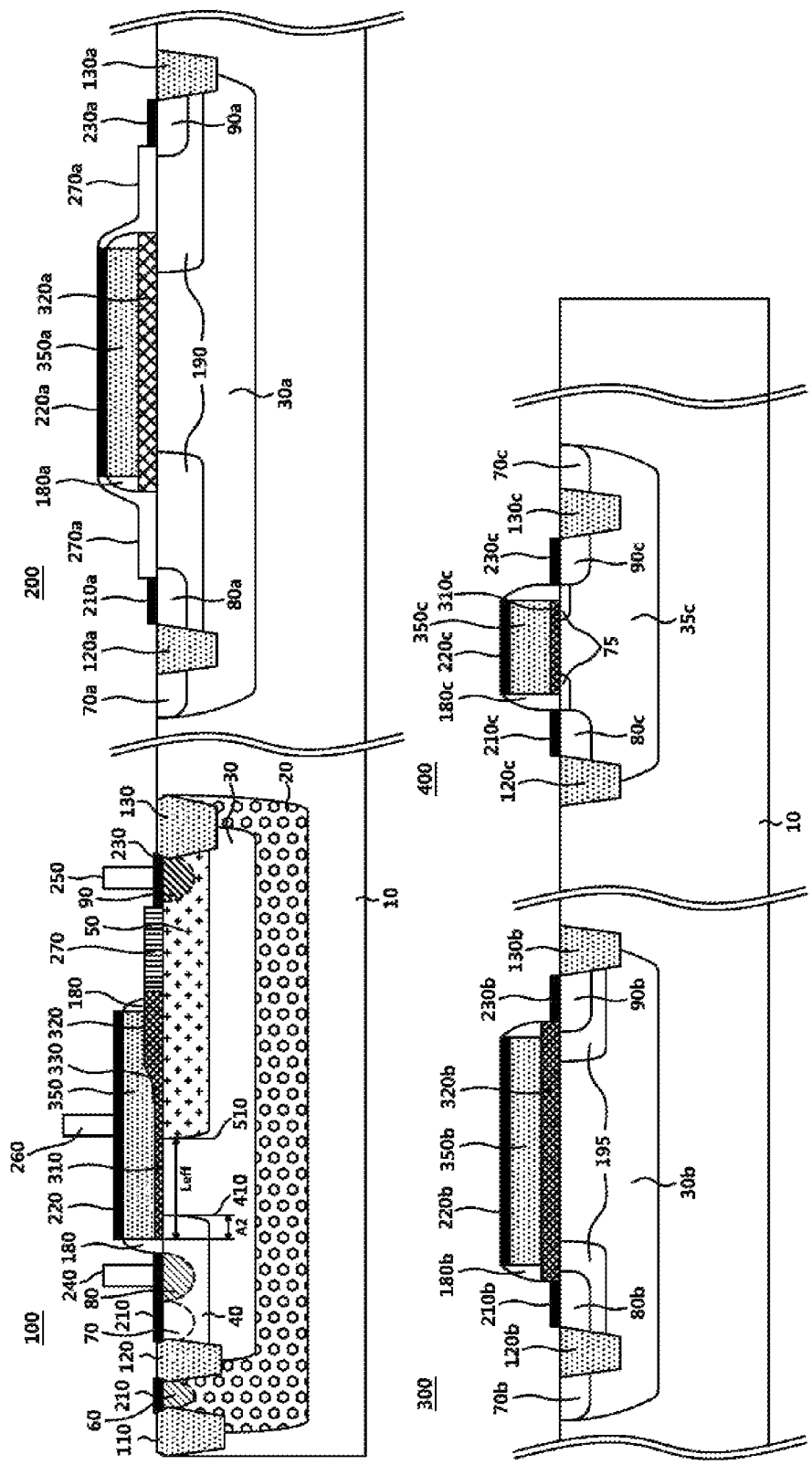
FIG. 9 is a cross-sectional view of a structure of a plurality of semiconductor devices according to examples of the present disclosure and a manufacturing method thereof.

FIG. 9 is a cross-sectional view of a structure of a plurality of semiconductor devices according to examples of the present disclosure and a manufacturing method thereof.

A plurality of semiconductor devices 100, 200, 300, and 400 are formed on one substrate 10 and the semiconductor devices may be used for driving a display panel such as an AMOLED, an OLED, or an LCD. For example, an nEDMOS semiconductor device 100, a high voltage semiconductor device 200, a medium voltage semiconductor device 300, and a low voltage semiconductor device 400 are disposed. The high voltage semiconductor device 200 may be used for all the devices used for output or input buffer. The medium voltage semiconductor device 300 may be used for a semiconductor device which serves as a digital to analog converter (DAC) or a buffer in a display driver IC. The low voltage semiconductor device 400 may be used for a semiconductor device which serves as a shift register or a latch in the display driver IC.

The high voltage semiconductor device 200 according to the example operates at about 10 to 100 V. The medium voltage semiconductor device 300 operates, for example, at about 5 to 10 V. The low voltage semiconductor device 400 operates, for example, at 5V or lower. Therefore, the thickness of the gate insulating film used for the high voltage semiconductor device 200 is the largest and the thicknesses are reduced in the order of the medium voltage semiconductor device 300 and the low voltage semiconductor device 400.

The nEDMOS semiconductor device 100 has been described in detail above, so that a description thereof will be omitted. The high voltage semiconductor device 200 includes a P-type second well region 30a (HPW), a N-type second drift region 190, an N-type source region 80a, an N-type drain region 90a, a P-type pick-up region 70a, a plurality of silicide layers 210a, 220a, and 230a, a second gate insulating film 320a, a gate electrode 350a, a spacer 180a, a silicide blocking insulating film 270a, and separating layers 120a and 130a, formed on the substrate 10.

The medium voltage semiconductor device 300 includes a P-type medium voltage well region 30b (MPW), an N-type third drift region 195, an N-type source region 80b, an N-type drain region 90b, a P-type pick-up region 70b, a plurality of silicide layers 210b, 220b, and 230b, a medium voltage gate insulating film 320b, a gate electrode 350b, a spacer 180b, and separating layers 120b and 130b, formed on the substrate 10. Here, a depth of the N-type third drift region 195 may be equal to or shallower than a depth of the N-type second drift region 190.

The low voltage semiconductor device 400 includes a P-type third well region 35c (PW), an N-type LDD region 75, an N-type source region 80c, an N-type drain region 90c, a P-type pick-up region 70c, a plurality of silicide layers 210c, 220c, and 230c, a third gate insulating film 320c, a gate electrode 350c, a spacer 180c, and separating layers 120c and 130c, formed on the substrate 10. In the low voltage semiconductor device 400, the LDD region having a depth shallower than a depth of the second drift region 190 or the third drift region 195 is used.

The thickness of the thick gate insulating film 320 of the nEDMOS semiconductor device 100 is equal to the thickness of the gate insulating films 320 or 320b of the medium voltage semiconductor device 300 or the high voltage semiconductor device 200 formed in the same chip. The gate insulating film may be selected depending on a type of level shift circuit which is used. Alternately, the selection criteria may vary depending on a type of products or a desired electrical characteristic. Differently from this, other gate insulating films may be combined in accordance with the characteristic of the nEDMOS semiconductor device 100.

When the gate insulating film is selected depending on whether to use a level shifter circuit, it is understood as follows: For example, when a level shifter circuit which is used for a product is changed from a low voltage to a high voltage, the gate insulating films 310 and 320 of the nEDMOS semiconductor device 100 may be configured by the third gate insulating film 310c and the second gate insulating film 320a. The gate insulating film 320a of the high voltage semiconductor device 200 is simultaneously used for the thick gate insulating film 320 of the nEDMOS semiconductor device 100. That is, when the gate insulating film 320a of the high voltage semiconductor device 200 is formed, the thick gate insulating film 320 of the nEDMOS semiconductor device 100 is simultaneously formed.

Alternately, when the level shifter circuit which is used for a product is changed from a low voltage to a medium voltage, the gate insulating films 310 and 320 of the nEDMOS semiconductor device 100 may be configured by the third gate insulating film 310c and the medium voltage gate insulating film 320b. The gate insulating film 320b of the medium voltage semiconductor device 300 is simultaneously used for the thick gate insulating film 320 of the nEDMOS semiconductor device 100. That is, when the gate insulating film 320b of the medium voltage semiconductor device 300 is formed, the thick gate insulating film 320 of the nEDMOS semiconductor device 100 is simultaneously formed.

Further, when the gate insulating film 310c of the low voltage logic device or the low voltage semiconductor device 400 is formed, the thin gate insulating film 310 of the nEDMOS semiconductor device 100 is simultaneously formed. By doing this, the manufacturing cost may be reduced.

The well regions of the high voltage/medium voltage semiconductor device and the well region of the nEDMOS device according to the example of the present disclosure may also be simultaneously formed. For example, when the well region 30 of the nEDMOS device is desired to be formed under the same condition as the second well region 30a, the well region 30 may be formed in the same step. Similarly, when the well region 30 of the nEDMOS device is desired to be formed under the same condition as the medium voltage well region 30b, the well region 30 may be formed in the same step. FIGS. 1 to 5 illustrate the above-described case.

Similarly, when the well region 30 of the nEDMOS semiconductor device 100 is desired to be formed under the same condition as the third well region 30c, the well region 35 may be formed in the same step. For example, FIG. 6 illustrates the above-described case. As described above, the well region 35 of the nEDMOS semiconductor device 100 is formed under the same condition as the well region 35c of the low voltage semiconductor device 400. The third well region 35c of the low voltage semiconductor device 400 and the third well region 35 of the nEDMOS semiconductor device 100 may be simultaneously formed. Therefore, the third well region 35c of the low voltage semiconductor device 400 and the third well region 35 of the nEDMOS semiconductor device 100 may have the same depth.

Figure 10:
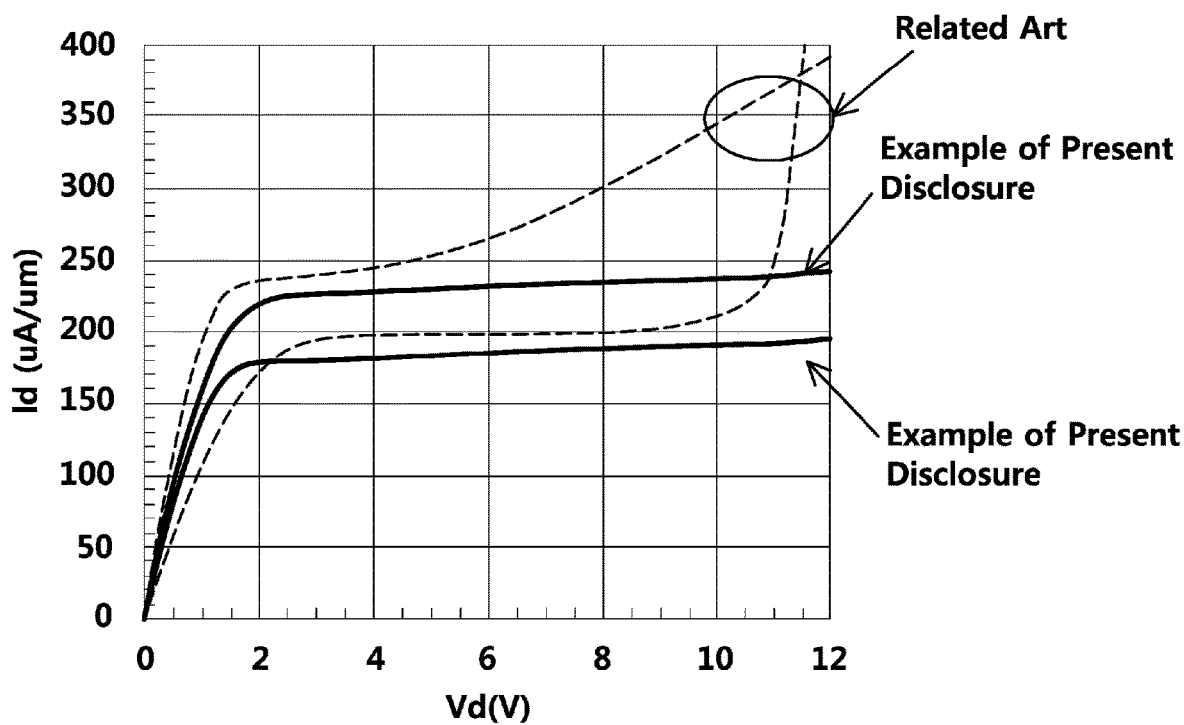
FIG. 10 is a graph of an electrical characteristic of a DMOS semiconductor device according to examples of the present disclosure.

FIG. 10 is a graph of an electrical characteristic of an example of a DMOS semiconductor device.

As illustrated in FIG. 10, in the DMOS semiconductor device, a stable saturation drain current IDsat is ensured and a snapback characteristic disappears. As described above, it is a result of increasing the effective channel length Leff or optimizing a dose amount of the second conductive type (N) second doping area 50. In contrast, in the semiconductor device manufactured by the related art, a snapback characteristic appears and an instable saturation drain current IDsat is generated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a substrate;
   a first conductive type first doping area formed in a first conductive type well region in the substrate;
   a second conductive type second doping area formed in the first conductive type well region in the substrate and spaced apart from the first conductive type first doping area;
   a second conductive type deep well region formed below the first conductive type first doping area; and
   a second conductive type highly-doped area formed in the second conductive type deep well region;
   a source region formed in the first conductive type first doping area;
   a drain region formed in the second conductive type second doping area;
   a gate insulating film formed between the source region and the drain region, comprising:
      a thin gate insulating film formed closer to the source region than the drain region;
      a thick gate insulating film formed to closer to the drain region than the source region; and
      a connecting insulating film disposed between the thin gate insulating film and the thick gate insulating film, and a thickness of the connecting insulating film being varied from a thickness of the thin gate insulating film and to a thickness of the thick gate insulating film; and
   a gate electrode formed on the gate insulating film,
   wherein a lower surface of the thin gate insulating film and a lower surface of the thick gate insulating film are coplanar, and the gate electrode covers more than half a length of the thick gate insulating film.

2. The semiconductor device according to claim 1, wherein an upper surface of the connecting insulating film has a slope, and each upper side of the thin gate insulating film and the thick gate insulating film is coplanar.

3. The semiconductor device according to claim 1, wherein the first conductive type first doping area is formed extended to a partial area of the thin gate insulating film in a direction of the source region to the drain region.

4. The semiconductor device according to claim 1, wherein the second conductive type second doping area is formed extended to a partial area of the thin gate insulating film in a direction of the drain region to the source region.

5. The semiconductor device according to claim 1, wherein the second conductive type second doping area is formed extended only to a partial area of the thick gate insulating film in a direction of the drain region to the source region.

6. The semiconductor device according to claim 1, wherein the second conductive type second doping area passes through the thick gate insulating film to extend to a partial area of the connecting insulating film in a direction of the drain region to the source region.

7. The semiconductor device according to claim 1, wherein the connecting insulating film connects the thin gate insulating film and the thick gate insulating film to each other.

8. The semiconductor device according to claim 1, wherein the drain region is spaced apart from the thick gate insulating film.

9. The semiconductor device according to claim 1, further comprising:
a silicide formed on the gate electrode, the source region, and the drain region.

10. The semiconductor device according to claim 1, further comprising an isolation region formed in the substrate and having a deeper depth from an upper surface of the substrate than the first conductivity type first doping area.

11. The semiconductor device according to claim 1, wherein the first conductivity type first doping area has a depth equal to a depth of the second conductivity type second doping area when measured from an upper surface of the substrate.

12. The semiconductor device according to claim 1, further comprising:
a silicide blocking insulating film disposed between the drain region and the thick gate insulating film,
wherein the silicide blocking insulating film contacts an upper side of the substrate.

13. The semiconductor device according to claim 12, wherein the second conductive type second doping area contacts the silicide blocking insulating film.

14. A method of manufacturing a semiconductor device, the method comprising:
forming a first conductive type first well region in a substrate;
forming a first gate insulating film on the first conductive type first well region, the first gate insulating film comprising a thin gate insulating film, a thick gate insulating film and a connecting insulating film connecting the thin gate insulating film and the thick gate insulating film, wherein a lower surface of the thin gate insulating film and a lower surface of the thick gate insulating film are coplanar to each other;
forming a first gate electrode on the first gate insulating film;
forming a source region and a drain region in the substrate;
forming a first conductive type second well region to be spaced apart from the first conductive type first well region;
forming a second conductive type first drift region in the first conductive type second well region; and
forming a second gate insulating film on the first conductive type second well region having similar thickness to the thickness of the thick gate insulating film,
wherein the thin gate insulating film is formed closer to the source region than the drain region, the thick gate insulating film is formed closer to the drain region than the source region, and the connecting insulating film is disposed between the thin gate insulating film and the thick gate insulating film, and
wherein a thickness of the connecting insulating film varies from a thickness of the thin gate insulating film and to a thickness of the thick gate insulating film.

15. The method of manufacturing the semiconductor device of claim 14, further comprising:
forming a first conductive type third well region to be spaced apart from the first conductive type first well region; and
forming a third gate insulating film on the first conductive type third well region having similar thickness to the thickness of the thin gate insulating film.

16. The method of claim 14, wherein the forming of the first conductive type first well region and the forming of the first conductive type second well region are simultaneously performed, and
wherein the forming of the thick gate insulating film of the first gate insulating film and the forming of the second gate insulating film are simultaneously performed.

17. The method of claim 14, further comprising:
simultaneously forming a second conductive type second drift region in the first conductive type second well region while forming the second conductivity type first drift region; and
simultaneously forming a second gate electrode on the second gate insulating film while forming the first gate electrode.

18. The method of claim 14, further comprising:
forming a second conductive type deep well region formed in the substrate; and
forming a second conductive type highly-doped area formed in the second conductive type deep well region.

19. The method of claim 14, further comprising forming a first conductive type first doping area and a second conductive type second doping area in the first conductive type first well region.

20. The method of claim 19, wherein the source region and the drain region are formed in the first conductive type first doping area and the second conductive type second doping area, respectively.

21. A semiconductor device, comprising:
a first conductive type first well region in a substrate;
a first gate insulating film on the first conductive type first well region, the first gate insulating film comprising a thin gate insulating film, a thick gate insulating film and a connecting insulating film connecting the thin gate insulating film and the thick gate insulating film, wherein a lower surface of the thin gate insulating film and a lower surface of the thick gate insulating film are coplanar to each other;
a first gate electrode on the first gate insulating film;
a source region and a drain region in the substrate;
a first conductive type second well region spaced apart from the first conductive type first well region;
a second conductive type first drift region in the first conductive type second well region; and
a second gate insulating film on the first conductive type second well region having a thickness similar to that of the thick gate insulating film,
wherein the thin gate insulating film is formed closer to the source region than the drain region, the thick gate insulating film is formed closer to the drain region than the source region, and the connecting insulating film is disposed between the thin gate insulating film and the thick gate insulating film, and
wherein a thickness of the connecting insulating film varies from a thickness of the thin gate insulating film and to a thickness of the thick gate insulating film.

22. The semiconductor device of claim 21, further comprising:
a second conductive type deep well region formed below the first conductive type first well region; and
a second conductive type highly-doped area formed in the second conductive type deep well region.

23. The semiconductor device of claim 21, further comprising:

a first conductive type third well region spaced apart from the first conductive type first well region; and a third gate insulating film formed on the first conductive type third well region having a thickness similar to that of the thin gate insulating film.

24. The semiconductor device of claim 21, further comprising:

a second conductive type second drift region formed in the first conductive type second well region; and a second gate electrode formed on the second gate insulating film.

25. The semiconductor device of claim 21, further comprising a first conductive type first doping area and a second conductive type second doping area formed in the first conductive type first well region.

26. The semiconductor device of claim 25, wherein the source region and the drain region are formed in the first conductive type first doping area and the second conductive type second doping area, respectively.

* * * * *